(12) United States Patent
Kaida

(10) Patent No.: US 6,951,007 B2
(45) Date of Patent: Sep. 27, 2005

(54) WIRE LAYOUT DESIGN APPARATUS AND METHOD FOR INTEGRATED CIRCUITS

(75) Inventor: Hiromasa Kaida, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 126 days.

(21) Appl. No.: 10/436,045

(22) Filed: May 13, 2003

(65) Prior Publication Data
US 2004/0031010 A1 Feb. 12, 2004

(30) Foreign Application Priority Data
May 14, 2002 (JP) ..................................... P2002-138399

(51) Int. Cl.⁷ .............................................. G06F 17/50
(52) U.S. Cl. ........................................... 716/12; 716/6
(58) Field of Search ............................. 716/13, 12, 14, 716/7, 6

(56) References Cited

U.S. PATENT DOCUMENTS

| | | | | |
|---|---|---|---|---|
| 5,140,402 A | * | 8/1992 | Murakata | 257/499 |
| 5,361,214 A | | 11/1994 | Aoki | 716/13 |
| 5,442,236 A | * | 8/1995 | Fukazawa | 257/758 |
| 5,926,397 A | * | 7/1999 | Yamanouchi | 716/14 |
| 2001/0000427 A1 | * | 4/2001 | Miller et al. | 333/33 |

FOREIGN PATENT DOCUMENTS

| | | | | |
|---|---|---|---|---|
| JP | 8236633 A | * | 9/1996 | ........... H01L/21/82 |
| JP | 9-129738 | | 5/1997 | |
| JP | 9-181184 | | 7/1997 | |
| JP | 9181184 | * | 11/1997 | ........... H01L/21/82 |

* cited by examiner

Primary Examiner—Stacy A. Whitmore
Assistant Examiner—Sun James Lin
(74) Attorney, Agent, or Firm—Oblon, Spivak, McClelland, Maier & Neustadt, P.C.

(57) ABSTRACT

An apparatus executes wire layout design in an integrated circuit. The apparatus includes a logic cell arrangement information acquisition unit which acquires information concerning a logic cell arrangement on a chip, a wire-grouping unit which estimates wires between logic cell terminals based on the acquired information and groups the estimated wires into each wire layer region, a via setting unit which sets via wire for pulling a logic cell terminal up to a wire layer region, a wire information extraction unit which extracts wire information for each of the wire groups and a routing execution unit which executes routing between the logic cell terminals for each of the wire layer regions based on the extracted information. A method for executing wire layout design in an integrated circuit includes acquiring information concerning a logic cell arrangement on a chip, executing wire-grouping, setting via wire for pulling a logic cell terminal up to a wire layer region, extracting wire information for each of the wire groups, and executing routing between the logic cell terminals for each of the wire layer regions based on the extracted information. The wire-grouping contains estimating wires between logic cell terminals based on the acquired information concerning the logic cell arrangement and dividing the estimated wires into each group of a wire layer region.

17 Claims, 14 Drawing Sheets

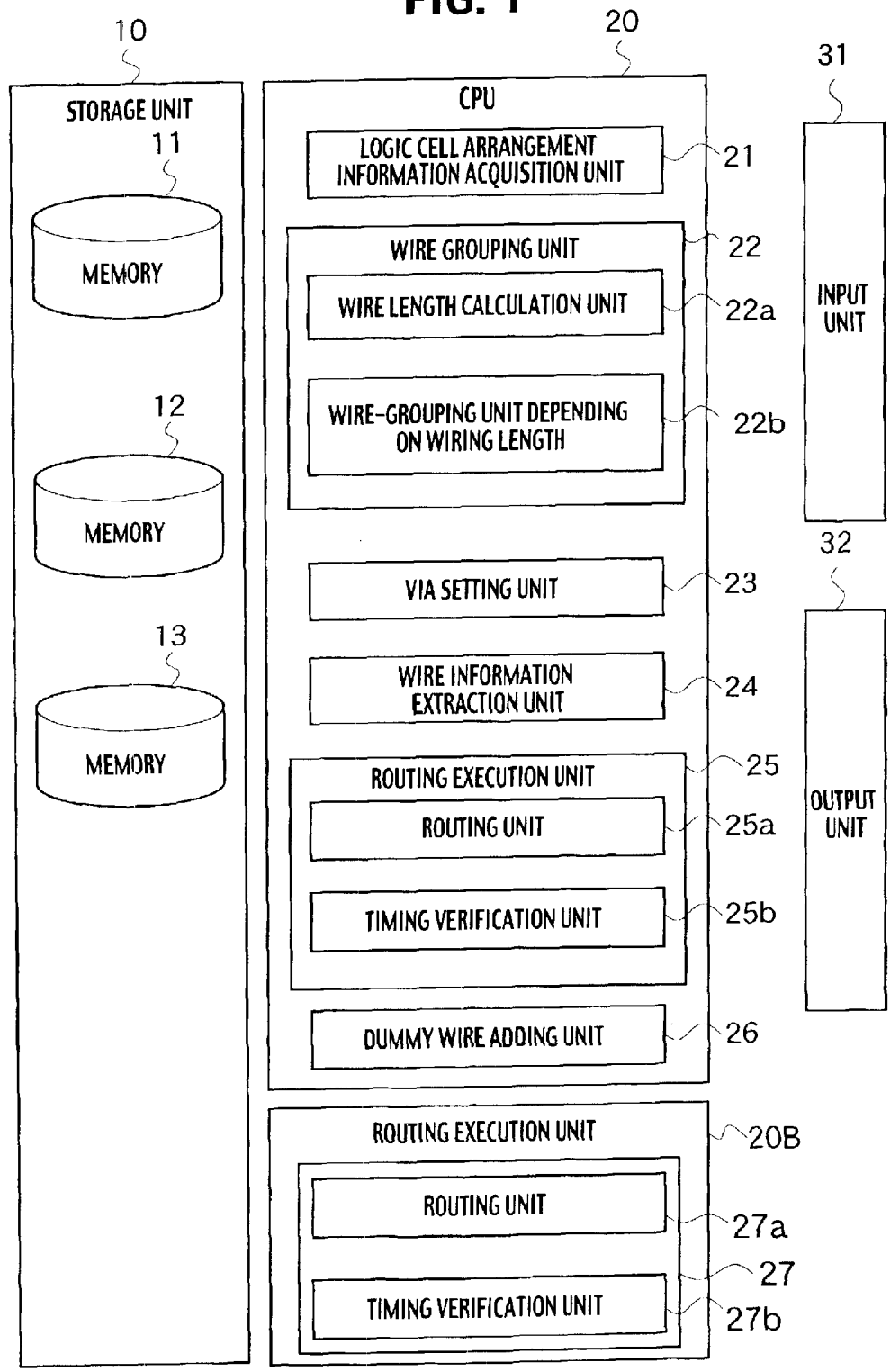

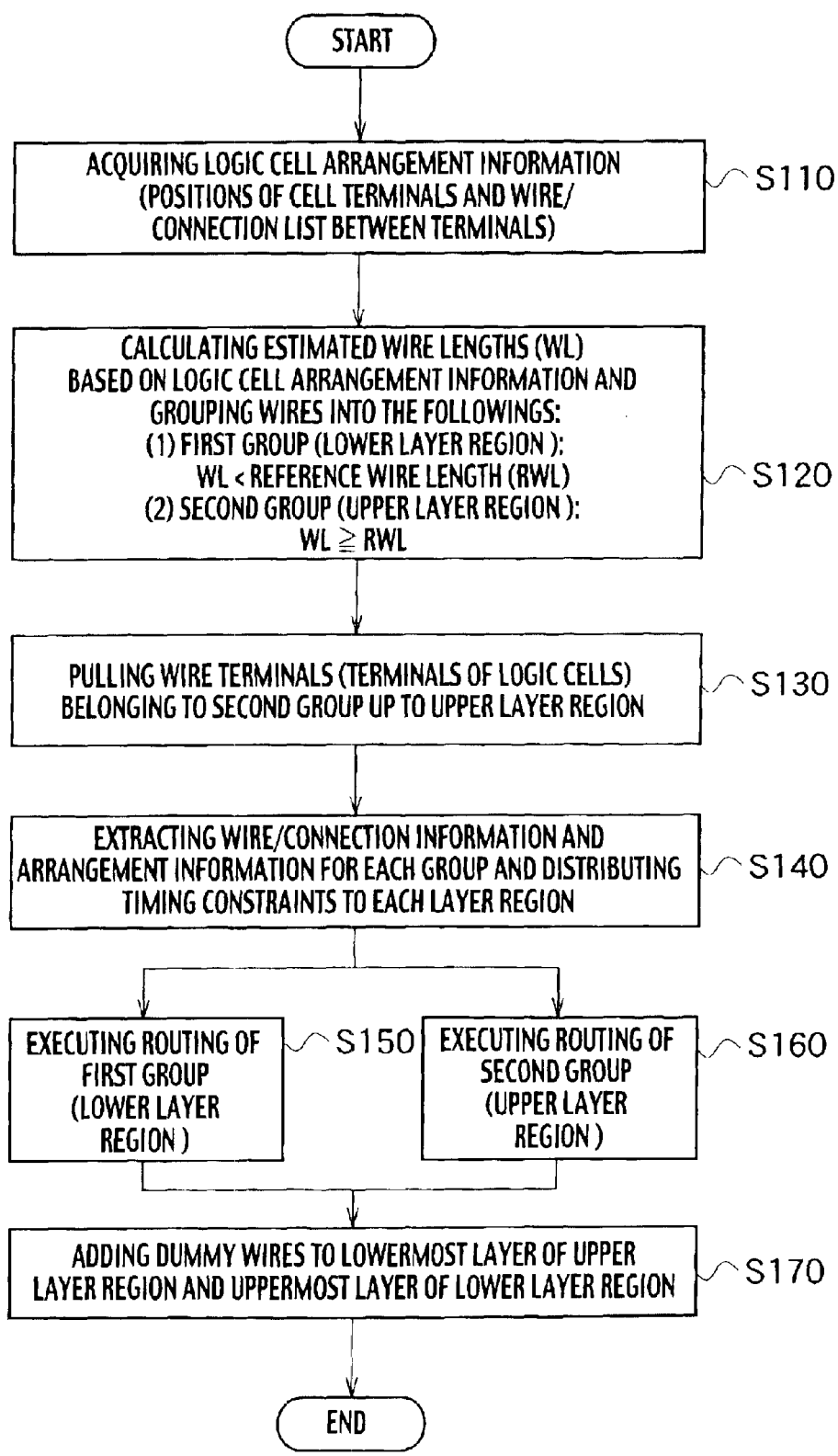

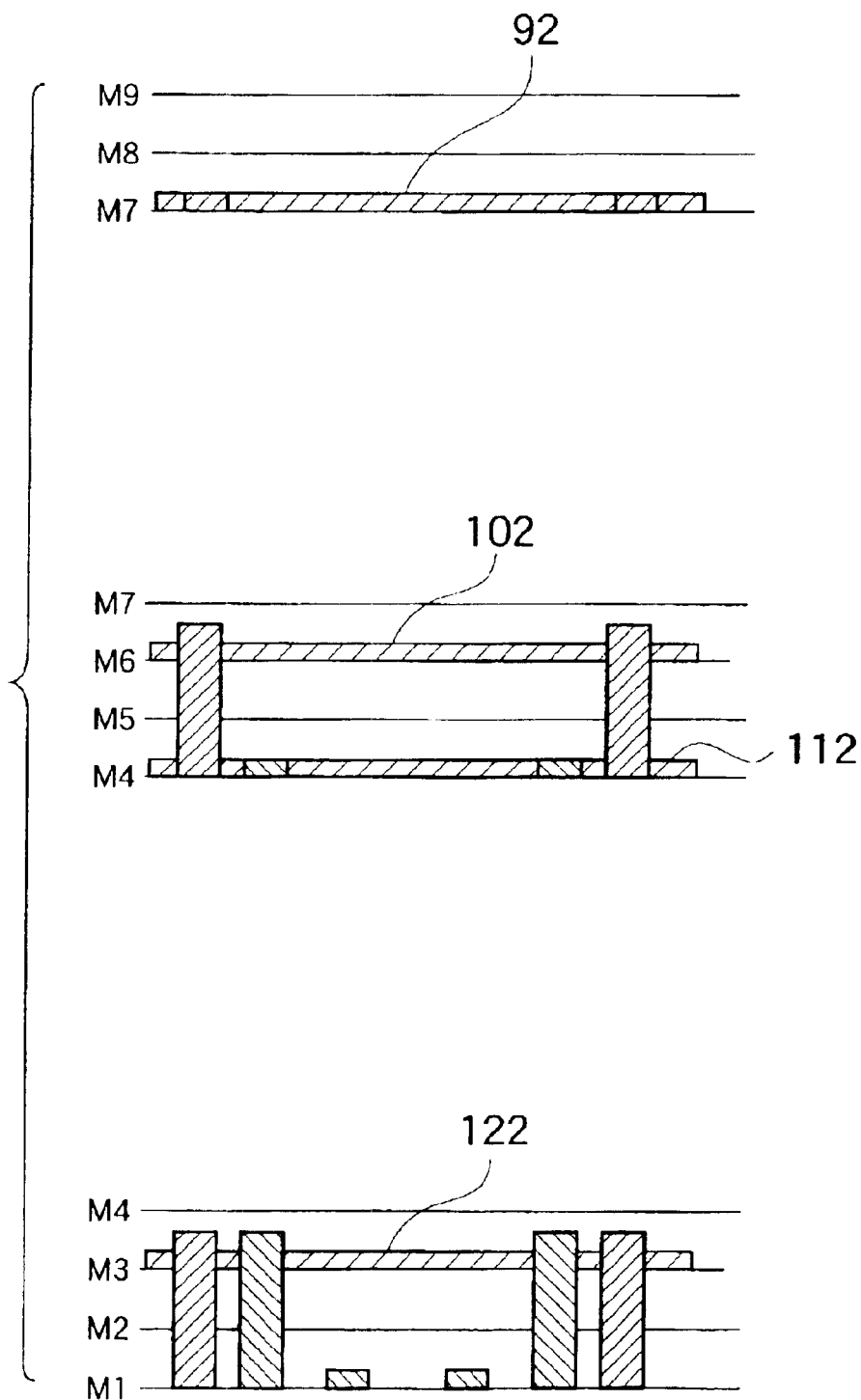

US 6,951,007 B2

WIRE LAYOUT DESIGN APPARATUS AND METHOD FOR INTEGRATED CIRCUITS

CROSS REFERENCE TO RELATED APPLICATION

This application is based upon and claims the benefit of priority from the prior Japanese Patent Application No. 2002-138399 filed on May 14, 2002, the entire contents of which are incorporated herein by reference.

BACKGROUND OF THE INVENTION

1. Field of the Invention

The present invention relates to design for a semiconductor integrated circuit. More particularly, the present invention relates to an apparatus, a method and a program for designing the semiconductor integrated circuit, which are used in a process of designing a wire layout between logic cells.

2. Description of the Related Art

In a layout design process for a system LSI, which is an important process in the entire design thereof, an arrangement of logic gates and automatic routing are executed by use of wire/connection information acquired by logic design and by use of a logic cell library prepared by circuit design. In this case, it is required to minimize a chip area.

As an integrated circuit has become larger in scale in recent years, necessary information involved in the circuit design has been increased more and more. A process time in each step and memory usage of a design apparatus used in the layout design process, which is a so-called CAD tool, tend to be increased.

In the case of executing automatic routing design for the LSI in the conventional layout design process, there has been employed: 1) a method for routing the entire chip all at one time; or 2) a hierarchical layout method, in which respective logic modules are implemented as hard macro, the modules implemented as hardware are arranged on a chip, and the modules implemented as hardware are mutually wired.

However, with regard to 1) the method for routing the entire chip all at one time, an increase of the memory usage and an increase of the process time are inevitable because the wire/connection information concerning the entire chip is dealt simultaneously. Accordingly, when the integrated circuit becomes large in scale, there also occur a possibility that the layout may be disabled by out-of-memory and a possibility that a design period may be prolonged.

Meanwhile, with regard to 2) the hierarchical layout method, such a problem of the memory usage is solved, which is inherent in the case of the routing executed all at one time, because limitations can be put on memory usage to be required. However, a degree of flexibility in routing is restricted because a region of the logic module is set as a routing forbidden area, resulting in an increase of the chip area. In addition, since each module is dealt independently of the others, it is difficult to overcome, at the design step, timing constraints on routing for the modules and process antenna constraints caused by an influence of charges accumulated between respective wire layers, which are generated in a device fabrication process. As a consequence, the design period for the chip tends to be prolonged.

SUMMARY OF THE INVENTION

An apparatus for executing wire layout design in an integrated circuit according to a first aspect of the present invention includes: a logic cell arrangement information acquisition unit which acquires information concerning a logic cell arrangement on a chip; a wire-grouping unit which estimates wires between logic cell terminals based on the acquired information concerning the logic cell arrangement and groups the estimated wires into each wire layer region; a via setting unit which sets via wire for pulling a logic cell terminal up to a wire layer region except for a lowermost wire layer region, the wire layer region having the logic cell terminal wire thereto; a wire information extraction unit which extracts wire information for each of the wire groups; and a routing execution unit which executes routing between the logic cell terminals for each of the wire layer regions based on the extracted information.

A method for executing wire layout design in an integrated circuit according to a second aspect of the present invention includes: acquiring information concerning a logic cell arrangement on a chip; executing wire-grouping, which estimates wires between logic cell terminals based on the acquired information concerning the logic cell arrangement and divides the estimated wires into each group of a wire layer region; setting via wire for pulling a logic cell terminal up to a wire layer region except for a lowermost wire layer region, the wire layer region having the logic cell terminal wire thereto; extracting wire information for each of the wire groups; and executing routing between the logic cell terminals for each of the wire layer regions based on the extracted information.

A program product executed by a computer according to a third aspect of the present invention includes: acquiring information concerning a logic cell arrangement on a chip; executing wire-grouping which estimates wires between logic cell terminals based on the acquired information concerning the logic cell arrangement and groups the estimated wires into each wire layer region; setting via wire for pulling a logic cell terminal up to a wire layer region except for a lowermost wire layer region, the wire layer region having the logic cell terminal wire thereto; extracting wire information for each of the wire groups; and executing routing between the logic cell terminals for each of the wire layer regions based on the extracted information.

BRIEF DESCRIPTION OF THE DRAWINGS

FIG. 1 is a constitutional view schematically illustrating a wire layout design apparatus according to a first embodiment of the present invention.

FIG. 2 is a flowchart of a wire layout design method according to the first embodiment of the present invention.

FIG. 8C is a plan view schematically illustrating a wire distributed in a middle layer region, the wire belonging to a second group, by the wire layout design method according to the second embodiment, and.

FIGS. 9A, 9B and 10 are cross-sectional views illustrating examples of routing states in respective steps in the wire layout design method according to the second embodiment of the present invention.

DETAILED DESCRIPTION OF THE INVENTION

<First Embodiment>

Figure 3A:
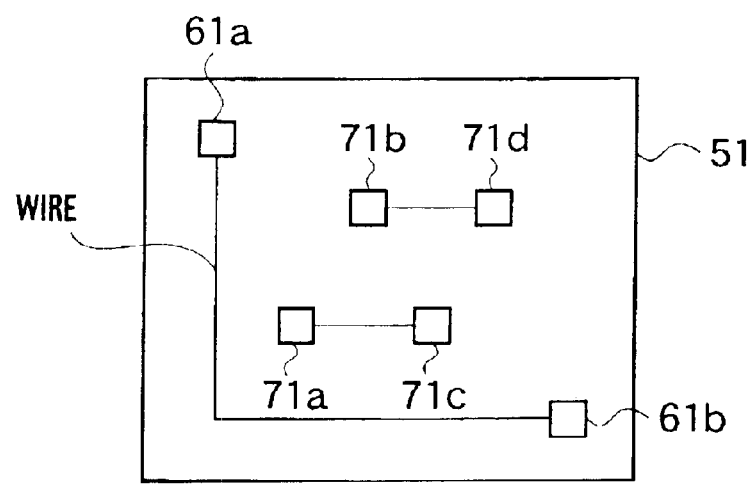
FIG. 3A is a plan view schematically illustrating wires scheduled on a chip.

FIG. 1 is a constitutional view of a semiconductor design apparatus according to a first embodiment of the present invention.

Various steps are included in design of an LSI, and the semiconductor design apparatus described here corresponds to an automatic routing CAD tool for routing between logic cells arranged on a chip. Note that it is possible for this apparatus to execute not only such routing but also layout design of logic cells and the like.

As illustrated in FIG. 1, the semiconductor design apparatus of the first embodiment includes at least the storage unit 10 having a plurality of memory regions 11, 12, 13 and the like and the CPU 20 corresponding to a computer. Note that, as illustrated in this drawing, it is preferable that a plurality of CPUs be provided in order to enable parallel routing processing. In addition, the input unit 31 and the output unit 32 are provided integrally or as external peripheral devices.

The storage unit 10 includes the plurality of memories 11 to 13, and for example, a program, logic cell arrangement information data, wire mask data acquired finally and the like are stored in each memory. The CPU 20 is provided with functions of various units as illustrated in FIG. 1 by executing the program, and a wire layout design of an integrated circuit is conducted by exerting the functions of these units.

The CPU 20 includes the logic cell arrangement information acquisition unit 21 which acquires the logic cell arrangement information stored in the memory units, the wire-grouping unit 22 which estimates wires between the logic cells based on the acquired logic cell arrangement information and divides the estimated wires on the chip into a plurality of groups, the via setting unit 23 which sets necessary via wires, the wire information extraction unit 24 which extracts wire information of a selected group, the routing execution unit 25 which executes the routing of the selected group, and the dummy wire adding unit 26 which adds dummy wire.

Note that, in the semiconductor design apparatus according to the first embodiment, further, the wire-grouping unit 22 includes the wire length calculation unit 22a which calculates estimated wire lengths, and the wire-grouping unit 22b which groups the wires depending on the wire lengths. This wire-grouping unit 22b distributes shorter wires than a reference wire length to a first group formed in a lower wire layer region and longer wires than the reference wire length to a second group formed in an upper wire layer region. Moreover, the routing execution unit 25 includes the routing unit 25a which generates the wires, and the timing verification unit 25b which verifies timing.

Moreover, the CPU 20B includes the routing execution unit 27 having the routing unit 27a and the timing verification unit 27b. The routing execution unit 27 executes the parallel processing together with the routing execution unit 25 of the CPU 20.

The wire layout acquired finally is stored as mask data in the memories in the storage unit 10, and is outputted by the output unit 32 such as a display, a printer and a plotter.

FIG. 2 is a flowchart showing a wire layout design method according to the first embodiment of the present invention. The wire layout design method by the above-described semiconductor design apparatus will be described with reference to this flowchart. Note that, though the number of wire layers formed on the semiconductor chip is not limited, the method will be described by taking, as an example, a case of a six-layer wire LSI having six wire layers.

In addition, it is assumed that the respective steps of the flowchart, which will be described below, are executed in the respective units of the CPUs 20 and 20B by the program stored in the memories of the storage unit 10.

First, the logic cell arrangement information supplied from the memories in the storage unit 10 or from the input unit 31 is acquired by the logic cell arrangement information acquisition unit 21 (S110). This logic cell arrangement information includes positions of cell terminals of the logic cells on the chip, a wire/connection list of terminals of logic cells required to be connected to one another, timing information and the like.

Next, the wires between the logic cells are estimated based on the acquired logic cell arrangement information and the estimated wire lengths between the logic cells are calculated by the estimated wire length calculation unit 22a of the wire-grouping unit 22. Subsequently, by the wire-grouping unit 22b which groups the wires depending on the wire lengths, wires of which estimated wire lengths are less than the reference wire length are classified into the first group that includes the lower layer region wires, and wires of which estimated wire lengths are equal to/more than the reference wire length are classified into the second group that includes the upper layer region wires (S120). Note that, though there are various ways of the estimation of wire and no limitations are put thereon, for example, the estimated wires can be obtained such that the logic cell terminals to be interconnected are routed at the shortest distance.

Figure 3B:
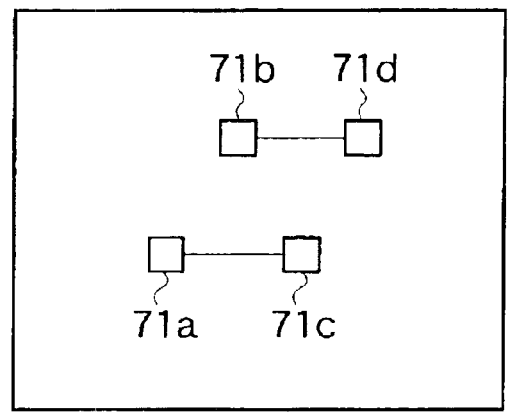
FIG. 3B is a plan view schematically illustrating wires distributed as wires in a lower layer region, the wires belonging to a first group, by the wire layout design method according to the first embodiment.
Figure 3C:
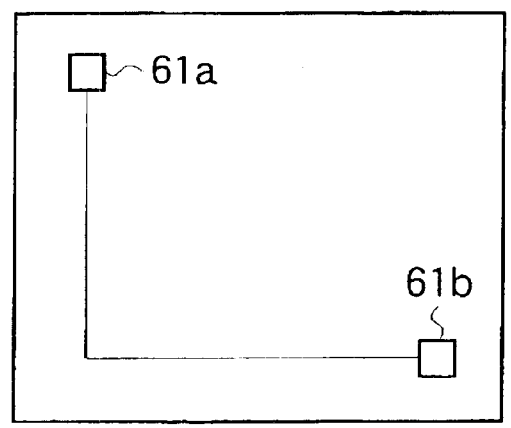
FIG. 3C is a plan view schematically illustrating a wire distributed as a wire in an upper layer region, the wire belonging to a second group, by the wire layout design method according to the first embodiment.

For example, as illustrated in FIG. 3A, the logic cell terminals 61a, 61b and 71a to 71d are arranged on the chip. Then, wires to be described below are estimated: a wire which interconnects the logic cell terminals 61a and 61b (hereinafter, referred to as "wire 61a–61b"); a wire which interconnects the logic cell terminals 71a and 71c (hereinafter, referred to as "wire 71a–71c"); and a wire which interconnects the logic cell terminals 71b and 71d (hereinafter, referred to as "wire 71b–71d"). In this case, if the reference wire length is set to a length ranging between the length of the wire 71a–71c and the length of the wire 61a–61b, then, as illustrated in FIGS. 3B and 3C, the wire 71a–71c and the wire 71b–71d, which are shorter than the reference wire length, are grouped into the first group that includes the lower layer region wires, and the wire 61a–61d longer than the reference wire length is grouped into the second group that includes the upper layer region wire.

Here, the reason that the group of the relatively long wire is placed as the upper layer region wire is that a lowering of wire resistance R and a reduction of a wire delay RC are rather facilitated in the upper layer region because linear wire is easy to arrange thereon and a wire is easy to widen in the event of routing due to the reason that there are few obstacles and routing forbidden regions.

Figure 5:
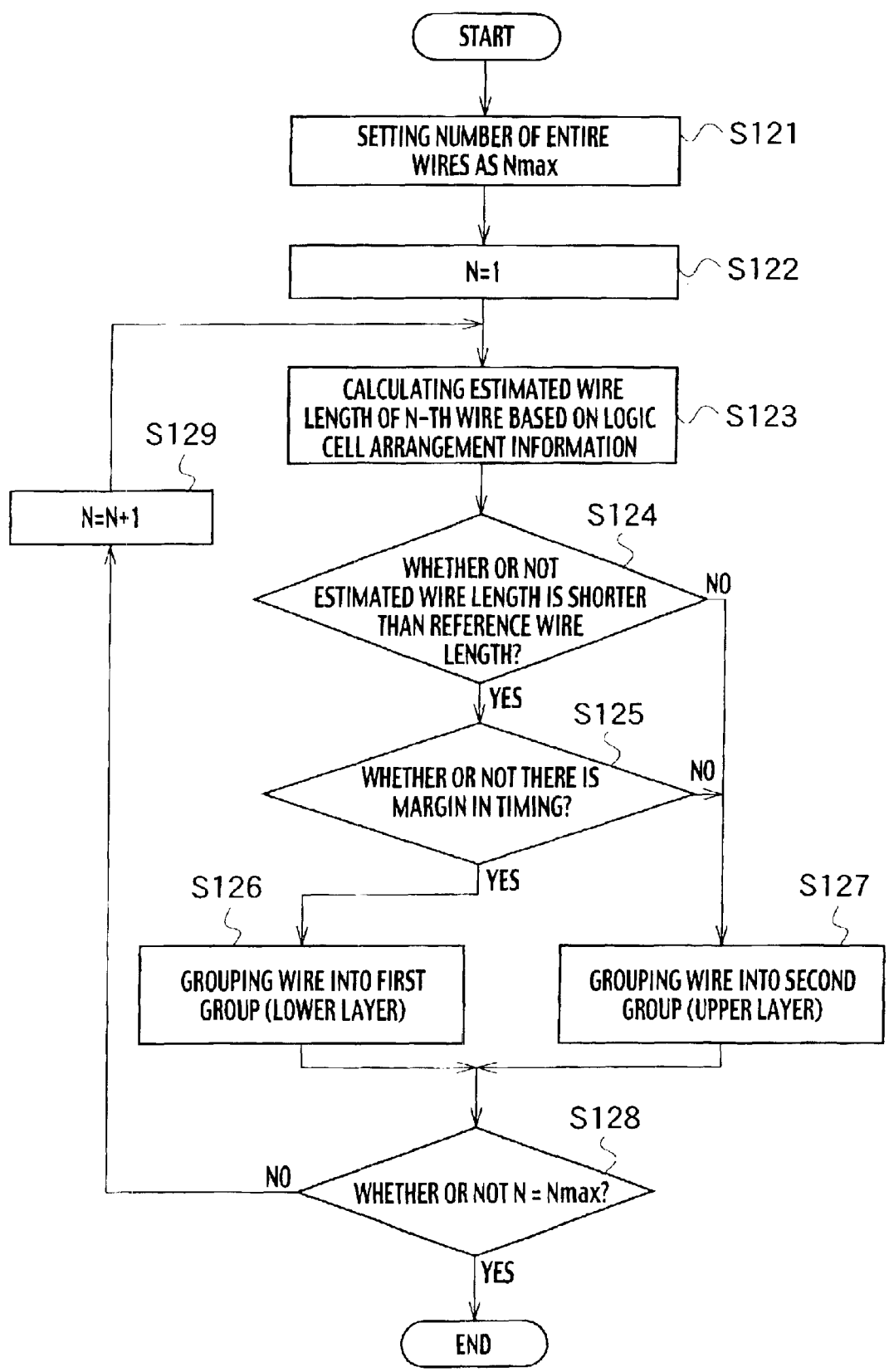
FIG. 5 is a flowchart for explaining a wire-grouping step in the wire layout design method according to the first embodiment.

Note that, in the wire-grouping step S120, specifically, the wire-grouping can be executed by the following steps (i) to (v) as illustrated in FIG. 5.

(i) The number of the entire wires is read from the wire/connection list and is denoted as Nmax, and the reference wire length is set (S121). Note that, while there are various methods for setting the reference wire length, the reference wire length may be set at an average wire length or the like, and may be externally supplied and designated.

(ii) Next, an initial setting in which N is set equal to 1 is executed (S122).

(iii) Wire information concerning N-th wire is taken out from the logic cell arrangement information, and an estimated wire length thereof is calculated (S123).

(iv) The estimated wire length and the reference wire length are compared with each other (S124). When the estimated wire length is equal to/more than the reference wire length, the concerned wire is distributed to the second group that will include the upper layer region wire (S127). On the other hand, when the estimated wire length is less than the reference wire length, further, the timing information included in the logic cell arrangement information is referred to, and it is determined whether or not there is a slack the timing (S125). When it is determined that there is a slack, the concerned wire is distributed to the first group that will include the lower layer region wire (S126). When it is determined that there is no slack, the concerned wire is distributed to the second group (S127). Grouping correction in consideration of the timing is executed in such a manner, and thus highly reliable routing with fewer timing errors can be executed.

(v) It is determined whether or not N is equal to Nmax (S128). When N does not reach Nmax, N is incremented by 1 (N=N+1) (S129), and the above-described steps S123 to S128 are repeated. When N reaches equal to Nmax, the processing is ended.

Figure 4A:
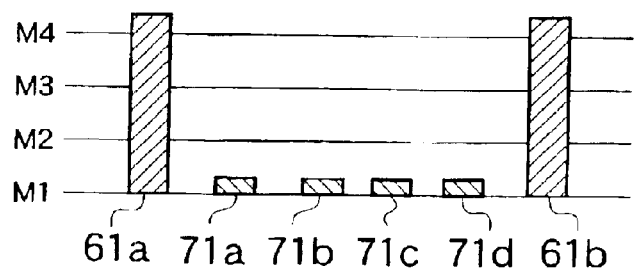
FIGS. 4A to 4C are cross-sectional views illustrating examples of routing states in respective steps in the wire layout design method according to the first embodiment.

The flowchart of FIG. 2 is referred to again. After the end of the grouping of the respective wires, processing is next executed, in which connection terminals of logic cells, which correspond to the terminals of the second group wires that become the upper layer region wires, are pulled up to the upper layer region (S130). Specifically, via wires reaching the wire layers of the upper layer region are set by the necessary via setting unit 23. A cross-sectional model of this wire is illustrated in FIG. 4A. Here, the case of the six-layer wire is shown as an example. Therefore, in this drawing, the wire layers of the lower layer region mean the first to third wire layers (M1 to M3), and the wire layers of the upper layer region mean the fourth to sixth wire layers (M4 to M6). By the processing of the step S130, the via wires are set, which pull up to the fourth wire layer (M4), the logic cell terminals 61a and 61b that are the wire terminals of the wire 61a–61b to be included in the upper layer region wire layer.

Figure 4B:
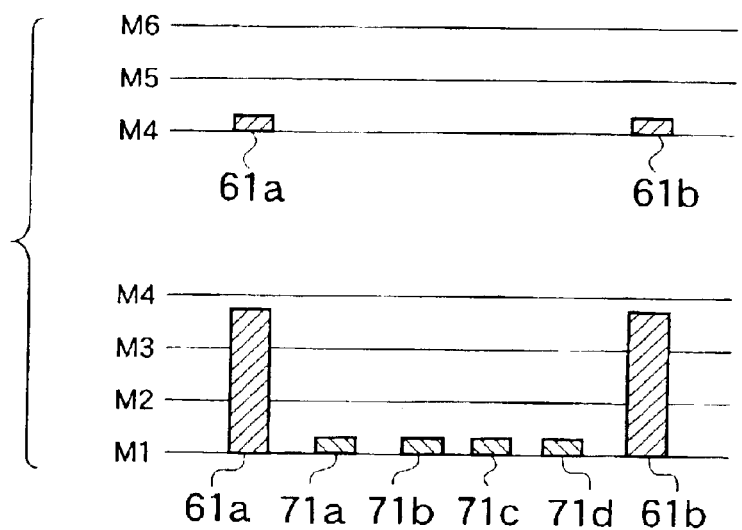

Next, with regard to the selected groups, the wire/connection information, the arrangement information and the like are extracted from each group by the wire information extraction unit 24, and the timing constraints of the entire chip is distributed to the upper region wire layer and the lower region wire layer (S140). Note that, as illustrated in FIG. 4B, the arrangement information also includes information concerning the routing forbidden regions such as via wire portions for the logic cell terminals 61a and 61b besides the information concerning the positions of the wire terminals (logic cell terminals) existing in the first wire layer (M1) and connections thereof.

Thereafter, based on the extracted wire/connection information, arrangement information and the like, the routing of the first group (lower layer region wire) and the routing of the second group (upper layer region wire) are executed in parallel to each other by the routing execution unit 25 in the CPU 20 and the routing execution unit 27 in the CPU 20B, respectively (S150 and S160).

Figure 6:
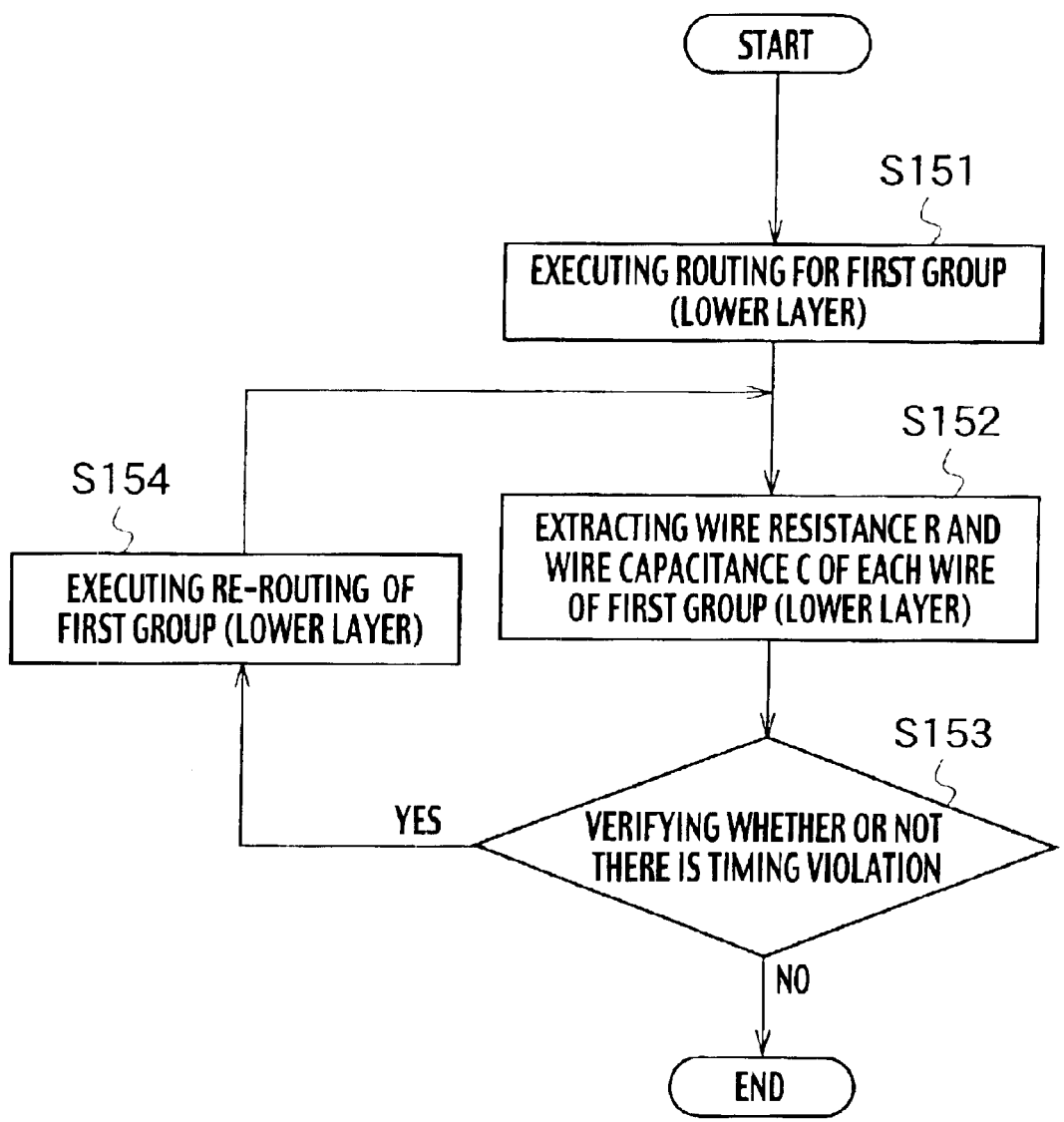
FIG. 6 is a flowchart for explaining a procedure for executing routing in the wire layout design method according to the first embodiment.
Figure 7:
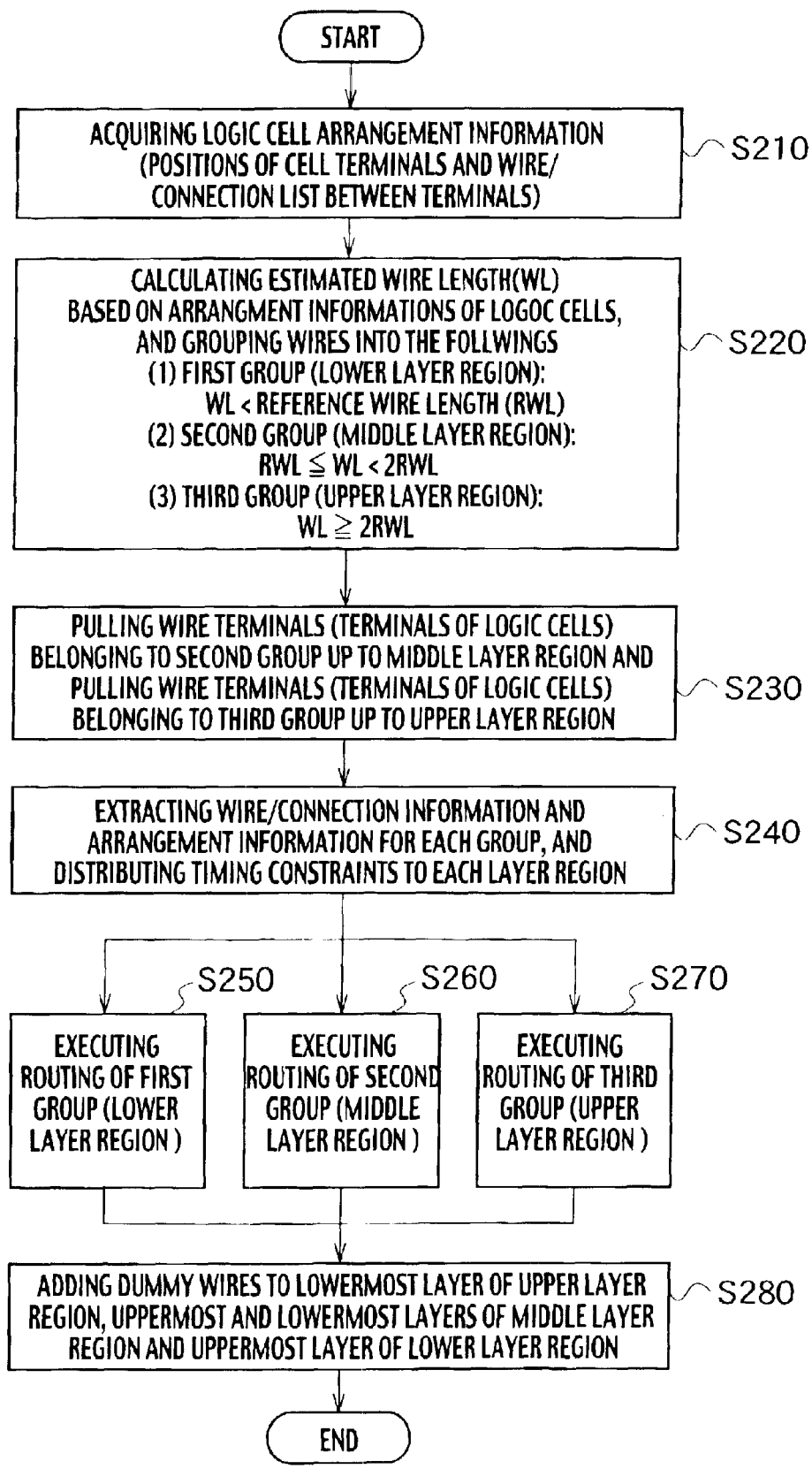
FIG. 7 is a flowchart in accordance with a wire layout design method according to a second embodiment of the present invention.

The specific method of the routing execution step for the first group is shown in the flowchart of FIG. 6. First, the routing is executed by the routing unit 25a or 27a based on the extracted wire/connection information and arrangement information (S151). Specifically, wires belonging to the first group are generated in the lower routing region from the first to third wire layers. For this routing technique, it is possible to use the conventional automatic routing method. After the routing is ended, the wire resistance R and wire capacitance C of each wire are extracted based on the generated wires (S152). Note that this extraction is executed on the assumption that the lowermost layer of the upper layer region, that is, the whole fourth wire layer is covered with a planar dummy wire such that the values of the wire resistance R and wire capacitance C can be extracted independently in the first group. Thereafter, the wire delay RC is calculated from the extracted values of the wire resistance R and wire capacitance C, and it is verified whether or not there is a timing violation of the timing constraints distributed to the first group (lower wire region) (S153). When there is a timing violation, re-routing is executed so as to reduce the wire delay RC (S154). The wire resistance R and the wire capacitance C are extracted again based on the re-routing (S152), and it is verified whether or not there is a timing violation (S153). When there is a timing violation, the routing is corrected, and re-routing is executed again. These steps S152 to S154 are repeated until the timing violation is eliminated, and routing without any timing violation is obtained finally. The verification of the timing, which is described above, is executed in the timing verification units 25b and 27b.

Note that it is allowed to further add a step of analyzing a crosstalk separately from the verification of the timing violation to verify the existence of a violation in terms of the crosstalk. In addition, it is allowed to add a verification step of an electrical breakdown and the like caused depending on an electric charge amount between the wires in the process for actually fabricating the device, which is called a process antenna constraint.

It is recommended to execute the routing of the second group (upper layer region wires) by steps similar to those in the case of the routing of the above-described first group. Note that, in the case of extracting the wire resistance R and wire capacitance C of the second group, the extraction is executed on the assumption that the uppermost wire layer of the lower layer region, that is, the third wire layer is covered with a dummy wire.

Figure 4C:
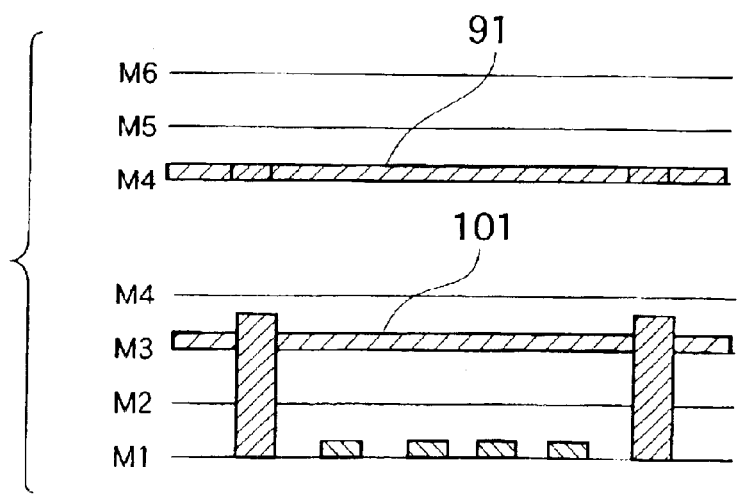

The flowchart of FIG. 2 is referred to again. After the end of the routing, the dummy wires are added to the fourth wire layer that is the lowermost layer of the upper layer region and to the third wire layer that is the uppermost layer of the lower layer region (S170) so as to coincide with the above-described verification conditions for the timing. Specifically, as illustrated in FIG. 4C, the dummy wires are added to regions of the third and fourth wire layers (M3 and M4), where the wires are not formed. Note that the dummy wires may satisfactorily be formed in a range where the calculation of the timing verification can coincide with the actual wires substantially in the routing execution step, and it is not necessary that the third and fourth wire layers (M3 and M4) be covered completely. In addition, the dummy wires are added so as not to short-circuit the already routed wires.

As mentioned above, in the wire layout design method according to the first embodiment of the present invention, in the event of routing between the logic cells, the wires of which lengths are shorter than the reference wire length are classified into the first group, and the wires of which lengths are longer than the reference wire length are classified into the second group. Then, the routing of the first group is executed in the lower layer region including the first to third wire layers, and the routing of the second group is executed in the upper layer region including the fourth to sixth wire layers. Both of the routings are executed independently of each other. In the event of routing each group, the number of objective logic cells and the number of connections between the logic cells can be reduced in comparison with the case of routing the entire groups all at one time. Hence, in the event of routing each group, the memory usage in the CPU, which is required for the operation processing therein, can be reduced to a great extent.

In the above-described method, the two CPUs (computers) are utilized, and the routing of the first group, which is executed by use of one CPU 20, and the routing of the second group, which is executed by use of the other CPU 20B, are executed simultaneously in parallel to each other. Therefore, the routing can be completed in a short time.

In the case of the conventional hierarchical layout method, each module is dealt independently of the others, and as for the routing between the modules, the region where one module is arranged becomes a routing forbidden region for the other modules. Therefore, the increase of the chip area is inevitable. On the other hand, in the above-mentioned wire layout design method according to the first embodiment, the degree of flexibility in routing is increased because the area of the routing forbidden region is small, and it is not necessary to increase the chip size.

Furthermore, in the conventional hierarchical layout method, the wire capacitance C and the like cannot be extracted as for the routing between the modules, and therefore, the total timing constraints and the like of the entire chip cannot be verified accurately. On the other hand, in the above-mentioned wire layout design method according to the first embodiment, the dummy wire layers are formed, and therefore, the wire resistance R and the wire capacitance C can be extracted accurately from each wire layer region. Hence, it is easy to overcome the timing constraints, the process antenna constraints and the like in the routing process in each of the wire layer regions, thus making it possible to enhance the wire reliability in the entire chip.

<Second Embodiment>

A wire layout design method according to a second embodiment is a modification example of the first embodiment. Specifically, while the case of the six wire layers has been taken as an example and the wire layout method for dividing the wires between the logic cells into the first and second groups has been described in the first embodiment, a wire layout method for dividing the wires between the logic cells into the first to third groups in the case of using nine wire layers will be described in the second embodiment.

Note that, because the fundamental configuration of the design apparatus and the designing method thereof are common to those according to the first embodiment, the second embodiment will be described briefly with reference to FIGS. 7 to 10.

First, the logic cell arrangement information is acquired (S210). Then, the following grouping procedures are executed in S220. The wire length of each wire is calculated based on the above information. Wires of which estimated wire lengths are less than the reference wire length are classified into the first group. Wires of which estimated wire lengths are equal to/more than the reference wire length and less than twice the reference wire length are classified into the second group. Wires of which estimated wire lengths are equal to/more than twice the reference wire length are classified into the third group. The wires of the first group are distributed to the first to third wire layers (lower layer region). The wires of the second group are distributed to the fourth to sixth wire layers (middle layer region). The wires of the third group are distributed to the seventh to ninth wire layers (upper layer region). Note that, preferably, a timing analysis is executed, and a correction is made such that wire strictly subjected to the timing constraints is distributed to a higher wire layer region.

Figure 8A:
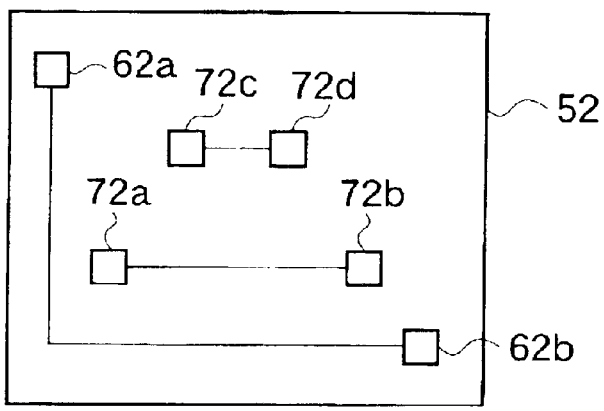
FIG. 8A is a plan view schematically illustrating wires scheduled on a chip.
Figure 8B:
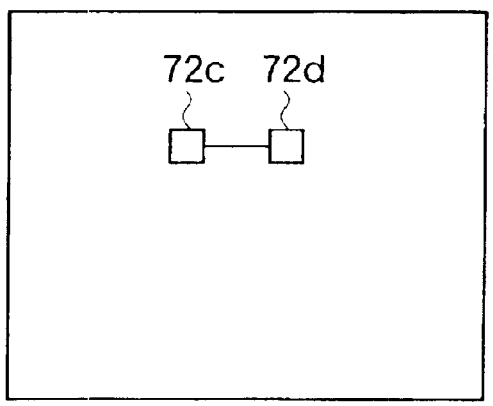
FIG. 8B is a plan view schematically illustrating a wire distributed in a lower layer region, the wire belonging to a first group, by the wire layout design method according to the second embodiment.
Figure 8C:
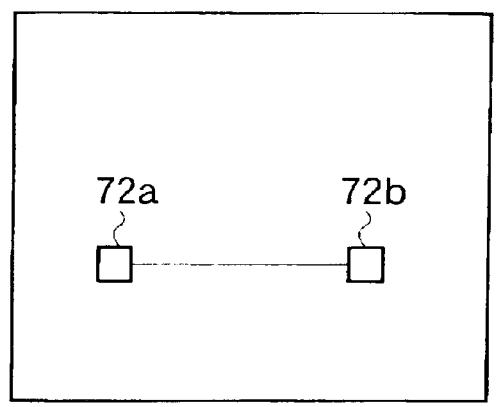
Figure 8D:
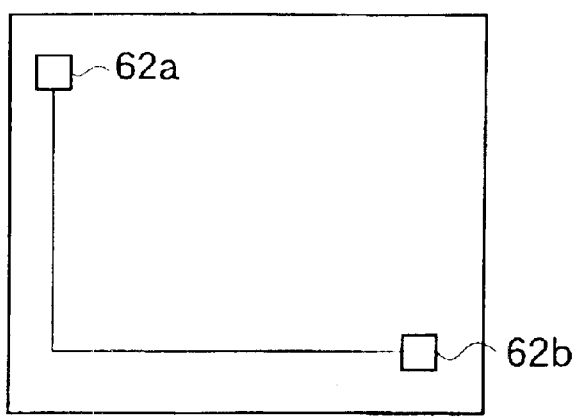
FIG. 8D is a plan view schematically illustrating a wire distributed in an upper layer region, the wire belonging to a third group, by the wire layout design method according to the second embodiment.

For example, a case is supposed as illustrated in FIG. 8A, where the logic cell terminals 62a, 62b, 72a, 72b, 72c and 72d are arranged on the chip 52, the wires 62a–62b, 72a–72b and 72c–72d are estimated, the reference wire length is longer than the wires 72c–72d and shorter than the wires 72a–72b. In such a case, as illustrated in FIG. 8B, the wires 72c–72d, 72a–72d and 62a–62b are distributed to the first to third groups, respectively.

Figure 9A:
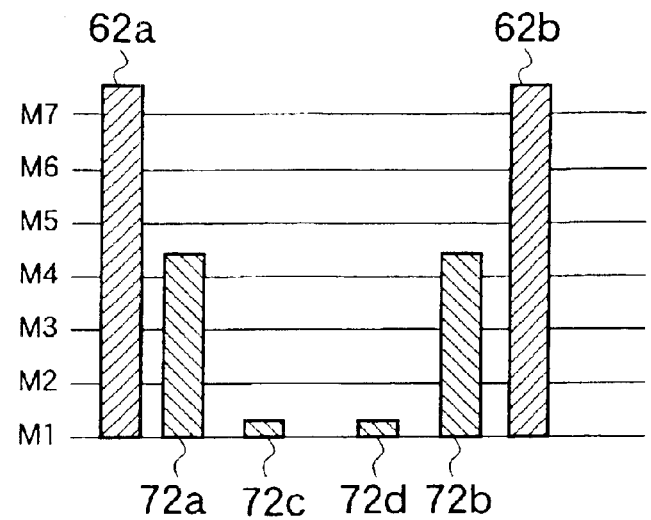

Next, as illustrated in FIG. 9A, the wire terminals (logic cell terminals) belonging to the second group are pulled up to the middle layer region, and the wire terminals (logic cell terminals) belonging to the third group are pulled up to the upper layer region. Specifically, via wires of the respective terminals are set (S230).

Figure 9B:
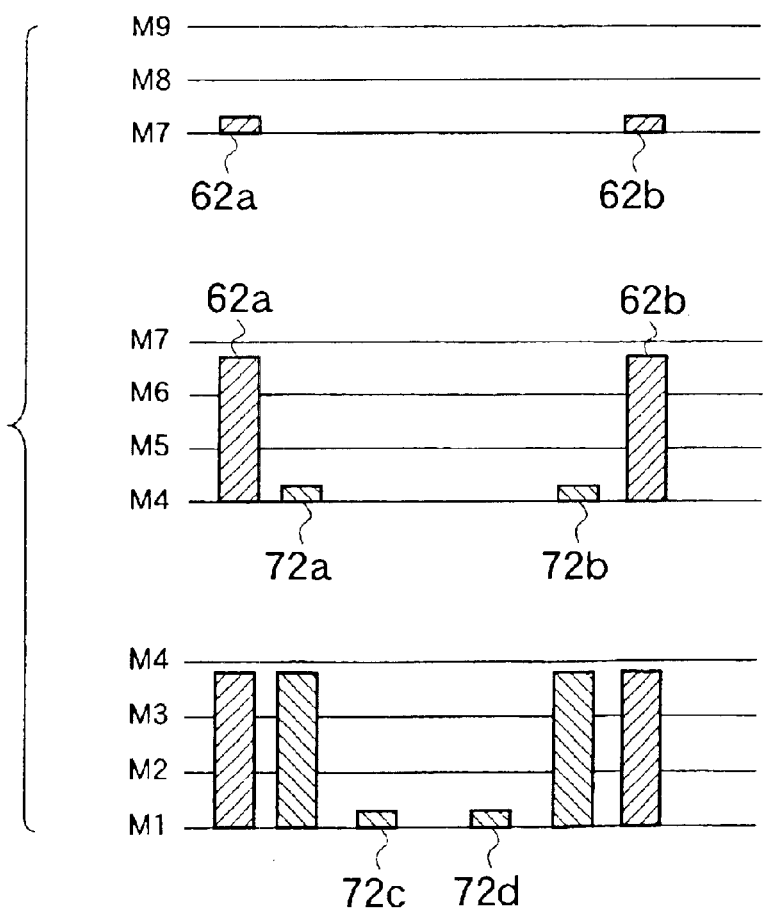

The wire/connection information and the arrangement information are extracted from each group, and the timing constraints are distributed to the respective layer regions (S240). Note that the arrangement information includes wire terminal information for each wire layer region and information concerning the via wires that become the routing forbidden regions as illustrated in FIG. 9B.

Thereafter, the routing of each group is executed independently of the others based on the extracted wire/ connection information and arrangement information (S250 to S270). Note that, with regard to the specific routing method of each group, a method similar to that in the flowchart of FIG. 6 can be used. In this case, it is desirable that three CPUs be provided in the semiconductor design apparatus according to the second embodiment in order to process the respective groups simultaneously.

Finally, the dummy wires which cover regions where the wires are not formed are added individually to the seventh wire layer (M7) that is the lowermost layer of the upper layer region, the fourth and sixth wire layers (M4 and M6) that are the uppermost and lowermost layers of the middle layer region, and the third wire layer (M3) that is the upper most layer of the lower layer region (S280) so as to coincide with the above-described timing verification conditions for the routing.

As mentioned above, even if the number of wires and the number of wire layers are increased, the number of group of the wires can be increased, the routing can be executed for each group independently of the others, and therefore, the memory usage necessary for each wire can be saved. Hence, if the number of CPUs is increased in accordance with the number of group of the wires and the routing for each wire layer region is executed independently of the others, the routing processing can be completed in an extremely short time. Moreover, the accurate wire resistance R and the wire capacitance C can be obtained for each group, and therefore, routing reliability in the entire chip can also be obtained.

<Third Embodiment>

In a wire layout design method according to the third embodiment, grouping for the wires between the logic cells is executed in a manner different from the methods according to the first and second embodiments.

Note that, while the fundamental configuration of the wire layout design apparatus is similar to the configuration of the wire layout design apparatus according to the first embodiment, which is illustrated in FIG. 1, the number of CPUs is set depending on the grouping number.

Figure 11:
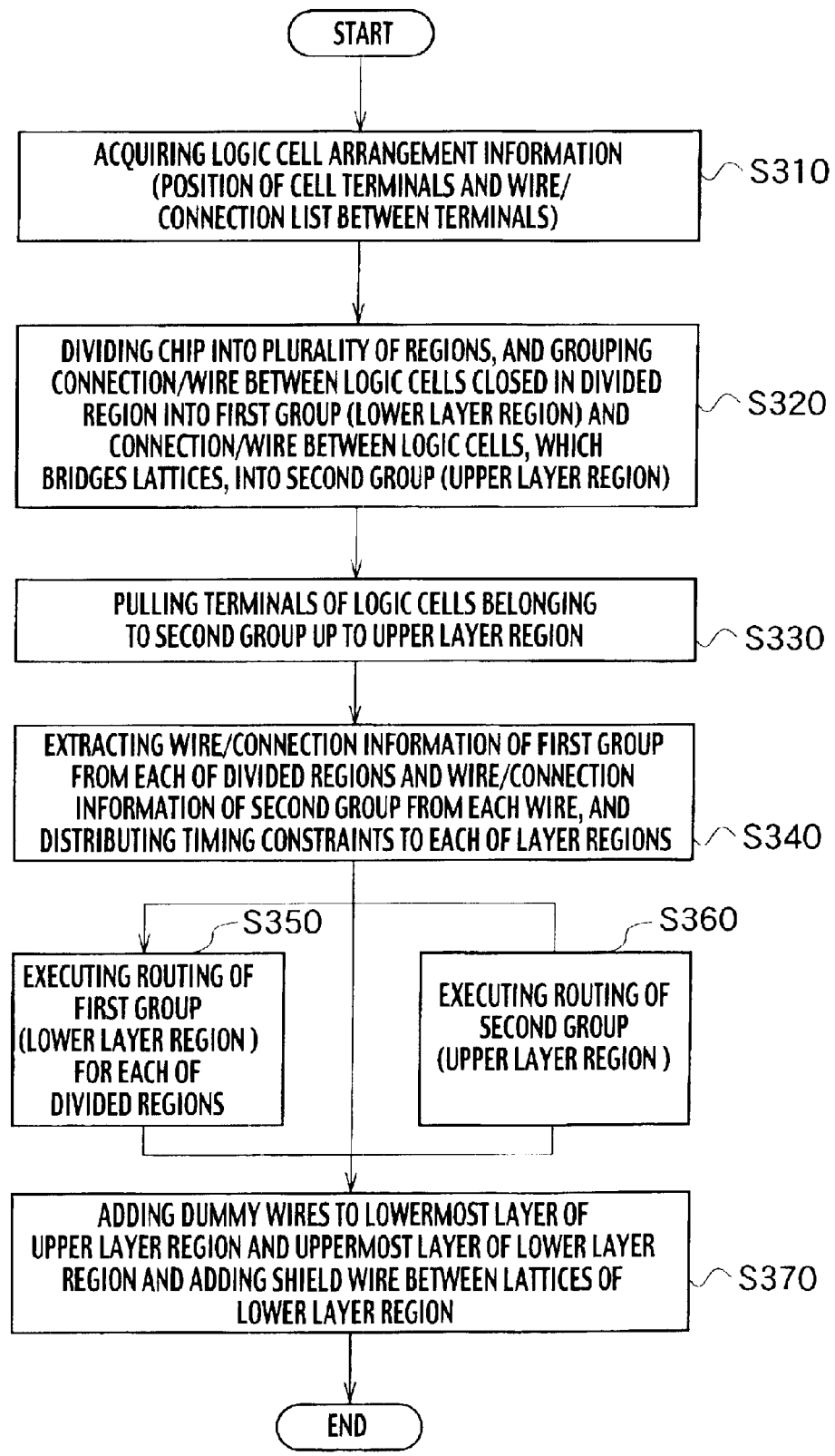
FIG. 11 is a flowchart in accordance with a wire layout design method according to a third embodiment of the present invention.

The wire layout design method according to the third embodiment will be described with reference to the flowchart shown in FIG. 11. Note that, though the number of wire layers formed on the semiconductor chip is not limited, the description will be made by taking the case of the six-layer wire LSI as an example.

First, the logic cell arrangement information such as the positions of the cell terminals and the wire/connection list of the terminals of the logic cells is acquired (S310).

Next, a chip plane is divided into a plurality of regions by a lattice-shaped boundary. Then, wires between the logic cells, which are closed in the divided regions, are classified into the first group, and wires between the logic cells, which bridge the plurality of divided regions, are classified into the second group (S320).

Figure 12A:
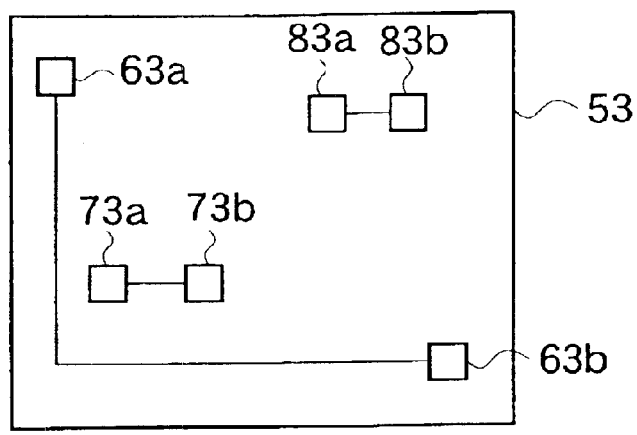
FIG. 12A is a plan view schematically illustrating wires scheduled on a chip.
Figure 12B:
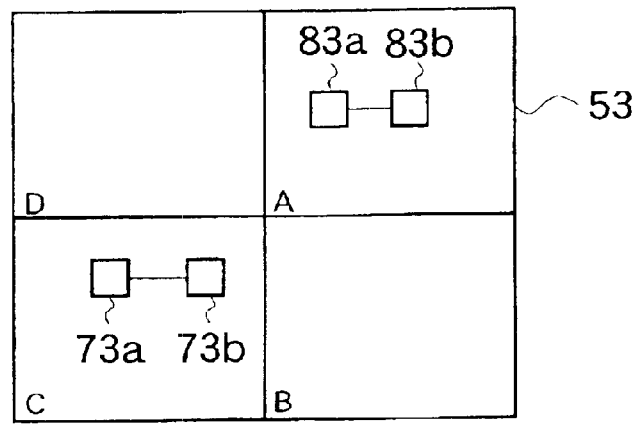
FIG. 12B is a plan view schematically illustrating wires distributed as wires in a lower layer region, the wires belonging to a first group, by the wire layout design method according to the third embodiment.
Figure 12C:
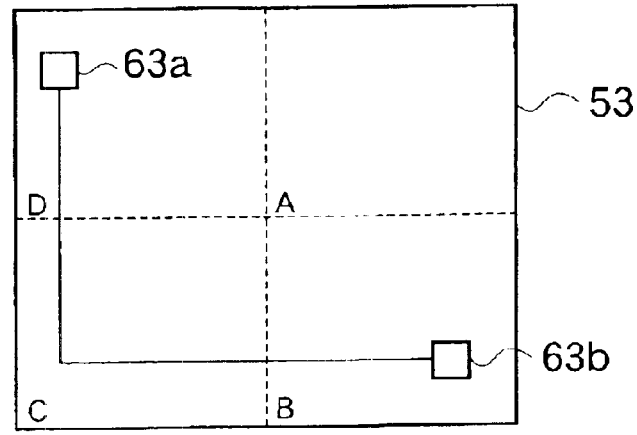
FIG. 12C is a plan view schematically illustrating a wire distributed as a wire in an upper layer region, the wire belonging to a second group, by the wire layout design method according to the third embodiment.

For example, a case is supposed as illustrated in FIG. 12A, where the logic cell terminals 63a, 63b, 73a, 73b, 83a and 83b are arranged on the chip 53, the wires 63a-63b, 73a–73b and 83a–83b connecting the respective terminals are estimated. In such a case, as illustrated in FIG. 12B, the chip plane is divided into the four regions A to D of which areas are equal to one another, the wires 73a–73b and 83a–83b between the logic cell terminals, which are closed in the respective regions, are classified into the first group, and the wire 63a–63b between the logic cell terminals, which bridges the plurality of regions B, C and D, is classified into the second group.

In general, the wire between the logic cell terminals, which bridges the plurality of regions, is a relatively long wire, and the wires between the logic cells, which are closed in the respective regions, are relatively short wires. Accordingly, if the second group that includes the relatively long wire is placed as the upper layer region wire, then it is easy to arrange the routing linearly because there are fewer obstacles and a so-called routing forbidden region is narrower in the upper layer region wire, and it is easy to lower the wire resistance and to reduce the wire delay because wider wire is able to made in addition.

Note that, specifically, the step S320 of grouping the wires can be executed in conformity with the method shown in the flowchart of FIG. 5 according to the first embodiment, and it is also possible to modify the grouping conditions such that wires having no slack in timing belong not to the first group but to the second group.

Figure 13A:
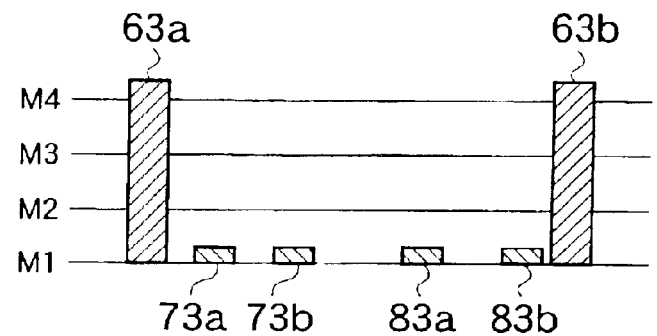
FIGS. 13A, 13B and 14A are cross-sectional views illustrating examples of wire states in respective steps in the wire layout design method according to the third embodiment of the present invention.

After the grouping of the respective wires is completed in such a manner, processing is next executed, in which the connection terminals of the logic cells (logic cell terminals), which correspond to the second group wires that become the upper layer region wires, are pulled up to the upper layer region (S330). Specifically, via wires reaching the upper layer region are formed. A cross-sectional model of this wire is illustrated in FIG. 13A. Here, by the processing of the step S330, the via wires are set, which pull, up to the fourth wire layer (M4), the logic cell terminals 63a and 63b that are the wire terminals of the wire 63a–63b to be included in the upper layer region wire layer.

Next, with regard to the first group corresponding to the lower layer region wires, the wire/connection information, the arrangement information and the like are extracted from each of the divided regions A to D. With regard to the second group corresponding to the upper layer region wires, the wire/connection information, the arrangement information and the like are extracted only from the group. The timing constraints of the entire chip are distributed individually to the divided regions A to D of the upper region wire layer and to the lower region wire layer (S340).

Figure 13B:
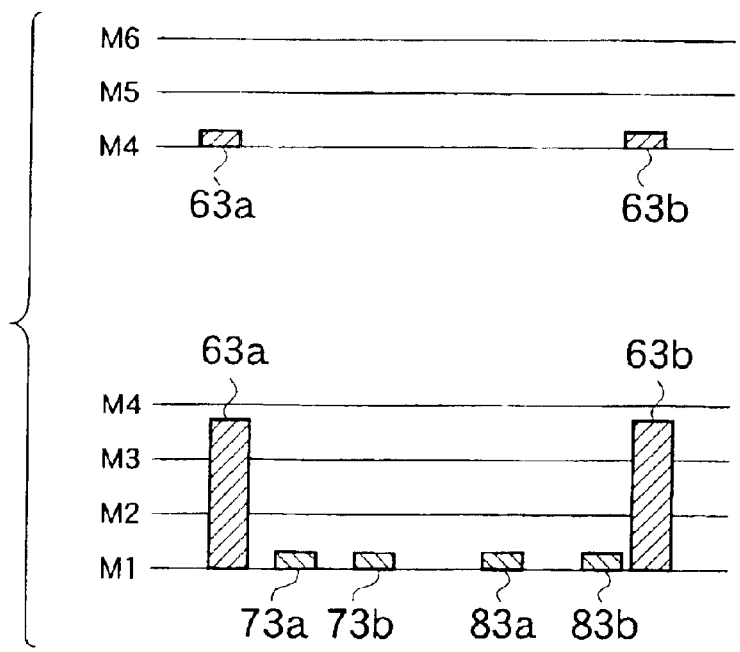

Note that, as illustrated in FIG. 13B, the arrangement information includes information concerning the routing forbidden region and the like as well as information concerning the positions of the logic cell terminals existing on the first wire layer and the connection thereof. Thereafter, the routing of the first group (lower layer region wire) and the routing of the second group (upper layer region wire) are executed independently in parallel to each other by use of the plurality of CPUs based on the extracted wire/connection information and arrangement information (S370).

Note that, with regard to the first group, it is desirable to execute the routing for each of the divided regions A to D on the chip surface based on the wire/connection information and the arrangement information, which are extracted from each thereof.

As a specific method for the routing execution steps (S350 and S360), a method similar to that according to the first embodiment, which is shown in FIG. 6, can be used. Specifically, first, the routing is executed for the wires belonging to the first group for each of the divided regions in the lower layer region including from the first to third wire layers based on the extracted wire/connection information and the arrangement information. After the end of the routing, the wire resistance R and wire capacitance C of each wire is extracted based on the routing actually executed. Note that, in order to enable the extraction of these values independently in each group, this extraction is executed on the assumption that the lowermost layer of the upper layer region, that is, the fourth wire layer is covered with the dummy wire, and that shield layers exist on the boundaries of the divided regions obtained by dividing the chip surface and the divided regions adjacent to each other are not mutually affected in the lower layer region.

Thereafter, the wire delay RC is calculated from the extracted wire resistance R and the wire capacitance C. Then, it is verified whether or not there is a timing violation against the timing constraints distributed to the divided regions of the first group (lower region wire layer). When there is a timing violation, re-routing is executed so as to reduce the wire delay RC. Such re-routing is repeated until the timing violation is eliminated. Besides the verification step of the timing violation, it is allowed to add an analysis step of a crosstalk and a verification step of process antenna constraints.

Finally, dummy wires are added to the fourth wire layer that is the lowermost layer of the upper layer region and to the third wire layer that is the uppermost layer of the lower layer region so as to coincide with the above-described verification conditions for the timing. In addition, in the case of executing the routing for each of the divided regions in the lower layer region, a shield wire is set on the boundaries of the divided regions of the lower layer region, which are obtained by dividing the chip surface (S370).

Figure 14A:
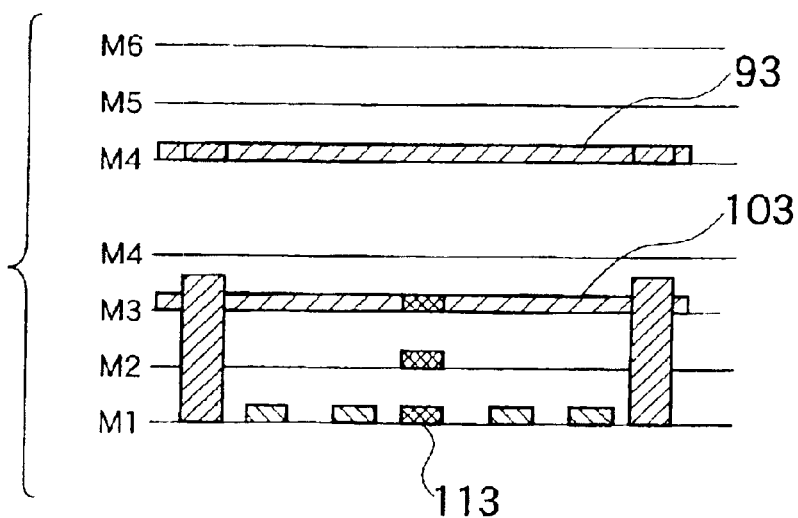
Figure 14B:
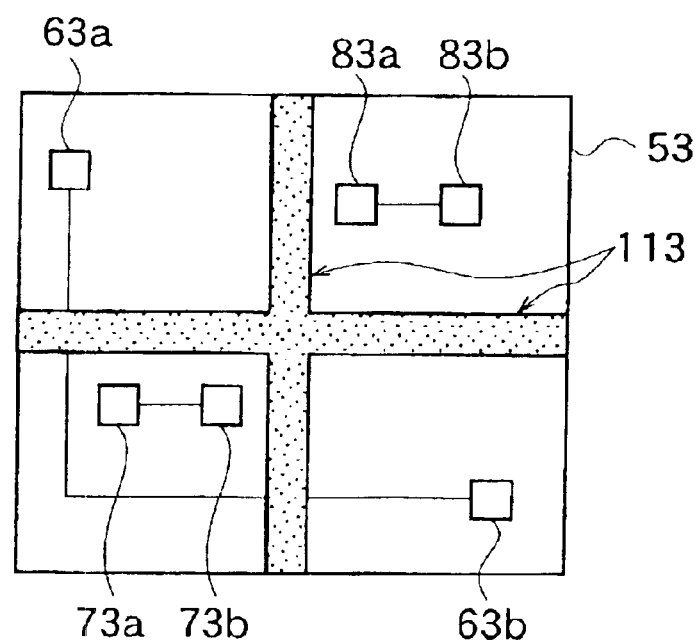
FIG. 14B is a plan view schematically illustrating a state of dummy wires and other wires, which are obtained by the wire layout design method according to the third embodiment.

FIG. 14A illustrates a state of the wire layers, where the dummy wires 93 and 103 and the shield wire 113 are formed. Meanwhile, FIG. 14B is a plan view of the wire layer, illustrating the arrangement of the shield wire 113. The dummy wires 103 and 93 are formed so as to substantially cover regions of the third and fourth wire layers (M3 and M4), where no wires are formed. Moreover, the shield wire 113 is formed on the boundaries of the divided regions of the chip, which belong to the first to third wire layers of the lower layer region.

Note that the dummy wires may satisfactorily be formed in a range where the calculation of the timing verification can coincide with the actual wires substantially in the routing execution step, and it is not necessary that the third and fourth wire layers (M3 and M4) be covered completely. In addition, the dummy wires are added so as not to short-circuit the already routed wires.

As mentioned above, in the wire layout design method according to the third embodiment of the present invention, the routing is executed for each of the upper and lower layer regions. With regard to the routing of the lower layer region, the regions are further divided on the chip, and the routing is executed independently for each of the divided regions. Therefore, the memory usage in the CPUs in the event of the routing can be reduced to a great extent.

Moreover, the dummy wire and the shield wire are added. Thus, with regard to the wires of the lower layer region, the routing is executed independently for each of the divided regions, and the timing analysis and the like for the routing can be executed with high reliability. Therefore, timing-driven wires satisfying the timing constraints can be formed also in the wires of the entire chip.

In addition, the routing for each of the divided regions of the first group and the routing of the second group can be executed independently of each other. Therefore, processing is executed therefore in parallel by use of the plurality of CPUs, thus making it possible to complete the routing processing in a short time.

Furthermore, though the third embodiment has been described by taking, as an example, the case where the chip plane is divided into four regions, the number of divided regions is not limited. Further, it is not always necessary that areas of the divided regions be equal to one another.

Although the first to third embodiments have been described as above, the present invention is not limited to the above-mentioned embodiments, and it is obvious to those skilled in the art that various modifications and improvements are enabled. For example, there are no limitations on the way and number of grouping of the wires, or the lengths of the wires are not limited to the above-mentioned ones. Grouping conditions such as distribution of clock wire and power supply wire to designated wire layer regions can also be added with regard to the function of the routing. In addition, it is also possible to execute the grouping such that the wires strictly subjected to the timing constraints are distributed to the wire layer region in the upper layer region, where the wire delay is easy to prevent.

According to the apparatus, method and program of the present invention, which are for designing the semiconductor integrated circuit, the wires are grouped for each of the wire layer regions, and the routing is executed for each of the wire layer regions. Therefore, in the event of routing each group, the number of objective logic cells and the number of wires between the logic cells can be reduced to a great extent. Hence, each routing can be processed at a high speed because the memory usage of the computers (CPUs) involved in the routing can be reduced. Moreover, the routing forbidden region caused by the division of the routing is relatively small because the routing is executed for each of the wire layer regions divided in the height direction. Hence, the degree of flexibility in routing is enhanced, and no increase of the chip area is brought. The reduction of the design period of time can be achieved.

What is claimed is:

1. An apparatus for executing wire layout design in an integrated circuit, comprising:

a logic cell arrangement information acquisition unit which acquires information concerning an integrated circuit logic cell arrangement a chip;

a wire-grouping unit which estimates wires between logic cell terminals based on the acquired information concerning the logic cell arrangement and groups the estimated wires into each wire layer region;

a via setting unit which sets a via wire for pulling a logic cell terminal up to a wire layer region except for a lowermost wire layer region, the wire layer region having the logic cell terminal wire thereto;

a wire information extraction unit which extracts wire information for each of the wire groups; and a plurality of routing execution units which execute routing between the logic cell terminals for each of the wire layer regions independently in a parallel process, based on the extracted information.

2. The apparatus of claim 1, wherein the wire-grouping unit calculates estimated wire lengths between the logic cell terminals from the acquired logic cell arrangement information, groups the wires into a plurality of groups depending on the estimated wire lengths thereof, and distributes a group of wires whose lengths are longer as a group to be arranged on a more upper wire layer region.

3. The apparatus of claim 1, wherein the wire-grouping unit divides a plane of the chip into a plurality of regions, classifies wires between the logic cell terminals, the wires being closed in each of the divided regions, into a first group where the wires are routed in a lower wire layer region, and classifies wires between the logic cell terminals, the wires bridging the plurality of regions, into a second group where the wires are routed in an upper layer region.

4. The apparatus of claim 3, wherein
the wire-grouping unit groups the wires belonging to the first group into each of the regions obtained by dividing the plane of the chip.

5. The apparatus of claim 1, wherein
the routing execution unit comprises:
a routing unit which executes routing; and
a timing verification unit which verifies timing for the executed routing.

6. The apparatus of claim 1, further comprising:
another routing execution unit,
wherein each of the routing execution units executes routing of any of the groups independently in parallel to each other.

7. The apparatus of claim 6, wherein
each of the routing execution units verifies timing of executed routing for each of the groups and repeats re-routing until a timing violation is eliminated.

8. The apparatus of claim 5, further comprising:
a dummy wire adding unit which adds dummy wires,
wherein the timing is verified on an assumption that any of uppermost and lowermost wire layers of a region of adjacent wire layers is covered with the dummy wires.

9. A method for executing wire layout design in an integrated circuit, comprising:
acquiring information concerning an integrated circuit logic cell arrangement on a chip;
executing wire-grouping, which estimates wires between logic cell terminals based on the acquired information concerning the logic cell arrangement and divides the estimated wires into each group of a wire layer region;
setting a via wire for pulling a logic cell terminal up to a wire layer region except for a lowermost wire layer region, the wire layer region having the logic cell terminal wire thereto;
extracting wire information for each of the wire groups; and
executing routing between the logic cell terminals for each of the wire layer regions independently in a parallel process based on the extracted information.

10. The method of claim 9, wherein
the wire-grouping comprises:
calculating estimated wire lengths between the logic cell terminals from the acquired logic cell arrangement information;
dividing the wires into a plurality of groups while setting the calculated wire lengths as references and distributing a group of wires whose lengths are longer as a group to be arranged on a more upper wire layer region.

11. The method of claim 9, wherein
the wire-grouping divides a plane of the chip into a plurality of regions, classifies wires between the logic cell terminals, the wires being closed in a single region, into a first group where the wires are routed in a lower wire layer region, and classifies wires between the logic cell terminals, the wires bridging the plurality of regions, into a second group where the wires are routed in an upper layer region.

12. The method of claim 11, wherein
the wire-grouping divides the wires belonging to the first group into each group of the regions obtained by dividing the plane of the chip.

13. The method of claim 9, wherein
the executing routing comprises:
executing routing; and
verifying timing for the executed routing.

14. The method of claim 9, wherein
the executing routing of each group independently in parallel to each other.

15. The method of claim 9, wherein
the executing routing comprises:
verifying timing for the executed routing for each group; and
executing re-routing when there is a timing violation.

16. The method of claim 13, wherein
the verifying timing is executed on an assumption that any of uppermost and lowermost wire layers of a region of adjacent wire layers is covered with a dummy wire, and
the method further comprises executing the dummy wire adding.

17. A program product executed by a computer for executing wire layout design in an integrated circuit, the program comprising:
acquiring information concerning an integrated circuit logic cell arrangement on a chip;
executing wire-grouping which estimates wires between logic cell terminals based on the acquired information concerning the logic cell arrangement and groups the estimated wires into each wire layer region;
setting a via wire for pulling a logic cell terminal up to a wire layer region except for a lowermost wire layer region, the wire layer region having the logic cell terminal wire thereto;
extracting wire information for each of the wire groups; and
executing routing between the logic cell terminals for each of the wire layer regions independently in a parallel process based on the extracted information.

* * * * *